United States Patent
Zhu et al.

(10) Patent No.: US 10,690,741 B2
(45) Date of Patent: Jun. 23, 2020

(54) METHOD AND SYSTEMS FOR REDUCING ARTIFACTS IN MAGNETIC RESONANCE IMAGING

(71) Applicant: General Electric Company, Schenectady, NY (US)

(72) Inventors: Quan Zhu, Lincolnshire, IL (US); Gaohong Wu, New Berlin, WI (US); Shaorong Chang, Hartland, WI (US); Richard Hinks, Waukesha, WI (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 144 days.

(21) Appl. No.: 15/965,763

(22) Filed: Apr. 27, 2018

(65) Prior Publication Data

US 2019/0331750 A1    Oct. 31, 2019

(51) Int. Cl.
*G01R 33/565* (2006.01)
*G01R 33/563* (2006.01)

(52) U.S. Cl.
CPC .  *G01R 33/56554* (2013.01); *G01R 33/56341* (2013.01); *G01R 33/56509* (2013.01)

(58) Field of Classification Search
CPC ........ G01R 33/56554; G01R 33/56341; G01R 33/56509
See application file for complete search history.

(56) References Cited

U.S. PATENT DOCUMENTS

| | | | |
|---|---|---|---|
| 5,498,963 A | 3/1996 | Schneider et al. | |
| 6,476,606 B2 * | 11/2002 | Lee | G01R 33/482 324/309 |
| 6,853,191 B1 | 2/2005 | Miller et al. | |
| 7,719,274 B2 | 5/2010 | Park et al. | |
| 7,847,545 B2 * | 12/2010 | Wiesinger | G01R 33/243 324/306 |
| 2009/0256568 A1 * | 10/2009 | Wiesinger | G01R 33/243 324/312 |

OTHER PUBLICATIONS

Ahn, C. et al., "A New Phase Correction Method in NMR Imaging Based on Autocorrelation and Histogram Analysis," IEEE Transactions on Medical Imaging, vol. MI-6, No. 1, Mar. 1987, 5 pages.
(Continued)

*Primary Examiner* — Dixomara Vargas
(74) *Attorney, Agent, or Firm* — McCoy Russell LLP

(57) ABSTRACT

Various methods and systems are provided for ghost artifact reduction in magnetic resonance imaging (MRI). In one embodiment, a method for an MRI system comprises acquiring a non-phase-encoded reference dataset, calculating phase corrections for spatial orders higher than first order from the non-phase-encoded reference dataset, acquiring a phase-encoded k-space dataset, correcting the phase-encoded k-space dataset with the phase corrections, and reconstructing an image from the corrected phase-encoded k-space dataset. In this way, ghost artifacts caused by phase errors during EPI may be substantially reduced, thereby improving image quality especially when imaging with a large field of view.

20 Claims, 10 Drawing Sheets

(56) References Cited

OTHER PUBLICATIONS

Xiang, Q. et al., "Correction for Geometric Distortion and N/2 Ghosting in EPI by Phase Labeling for Additional Coordinate Encoding (PLACE)," Magnetic Resonance in Medicine, vol. 57, No. 4, Apr. 2007, 11 pages.

Ianni, J. et al., "Ghost Reduction in Echo-Planar Imaging by Joint Reconstruction of Images and Line-to-Line Delays and Phase Errors," Magnetic Resonance in Medicine, vol. 79, No. 6, Jun. 2018, Published Online Oct. 16, 2017, 22 pages.

\* cited by examiner

12 US 10,690,741 B2

METHOD AND SYSTEMS FOR REDUCING ARTIFACTS IN MAGNETIC RESONANCE IMAGING

FIELD

Embodiments of the subject matter disclosed herein relate to magnetic resonance imaging, and particularly to ghost artifact reduction in echo planar imaging.

BACKGROUND

Echo planar imaging (EPI) is an ultrafast magnetic resonance imaging (MRI) technique that allows a single snapshot of the internal anatomy of a patient to be acquired with tens of microseconds. EPI thus enables accurate imaging without concern for patient movement (e.g., due to respiratory or cardiac motion), which may introduce imaging errors. During EPI, a single radio frequency (RF) pulse is applied, followed by phase-encoding and frequency-encoding gradients to spatially encode a slice of the patient, and raw MR data is rapidly acquired as the nuclei excited by the RF pulse relax.

BRIEF DESCRIPTION

In one embodiment, a method for an MRI system comprises acquiring a non-phase-encoded reference dataset, calculating phase corrections for spatial orders higher than first order from the non-phase-encoded reference dataset, acquiring a phase-encoded k-space dataset, correcting the phase-encoded k-space dataset with the phase corrections, and reconstructing an image from the corrected phase-encoded k-space dataset. In this way, ghost artifacts caused by phase errors during EPI may be substantially reduced, thereby improving image quality especially when imaging with a large field of view.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The present invention will be better understood from reading the following description of non-limiting embodiments, with reference to the attached drawings, wherein below.

DETAILED DESCRIPTION

Figure 7:
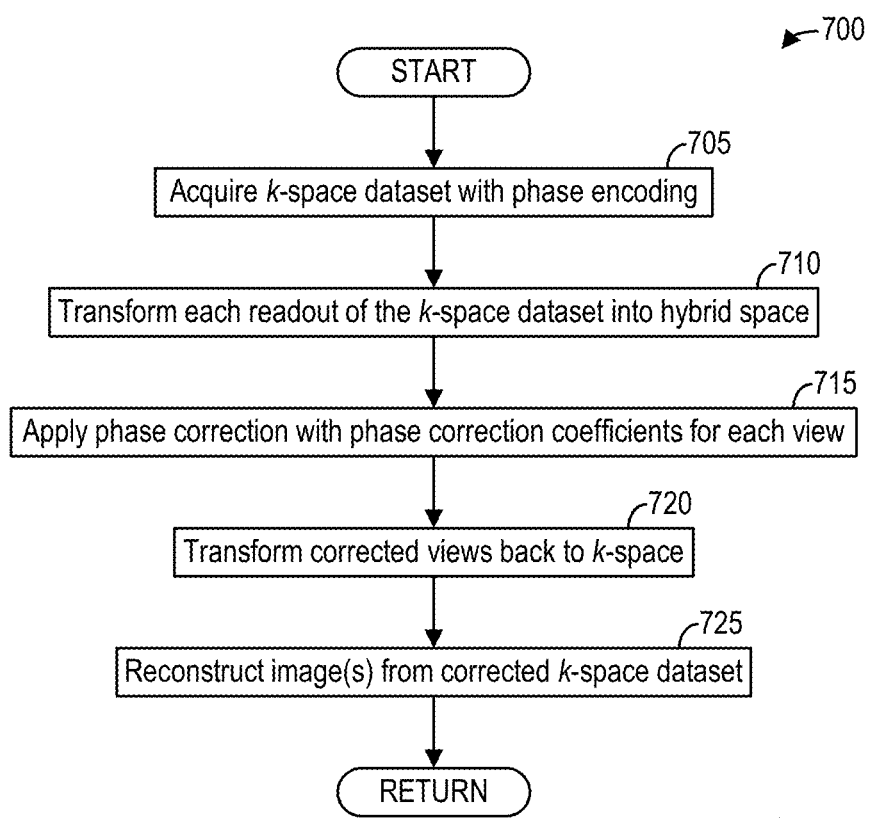
FIG. 7 shows a high-level flow chart illustrating an example method for reconstructing phase-corrected images with the phase correction coefficients of FIG. 5 according to an embodiment.
Figure 8:
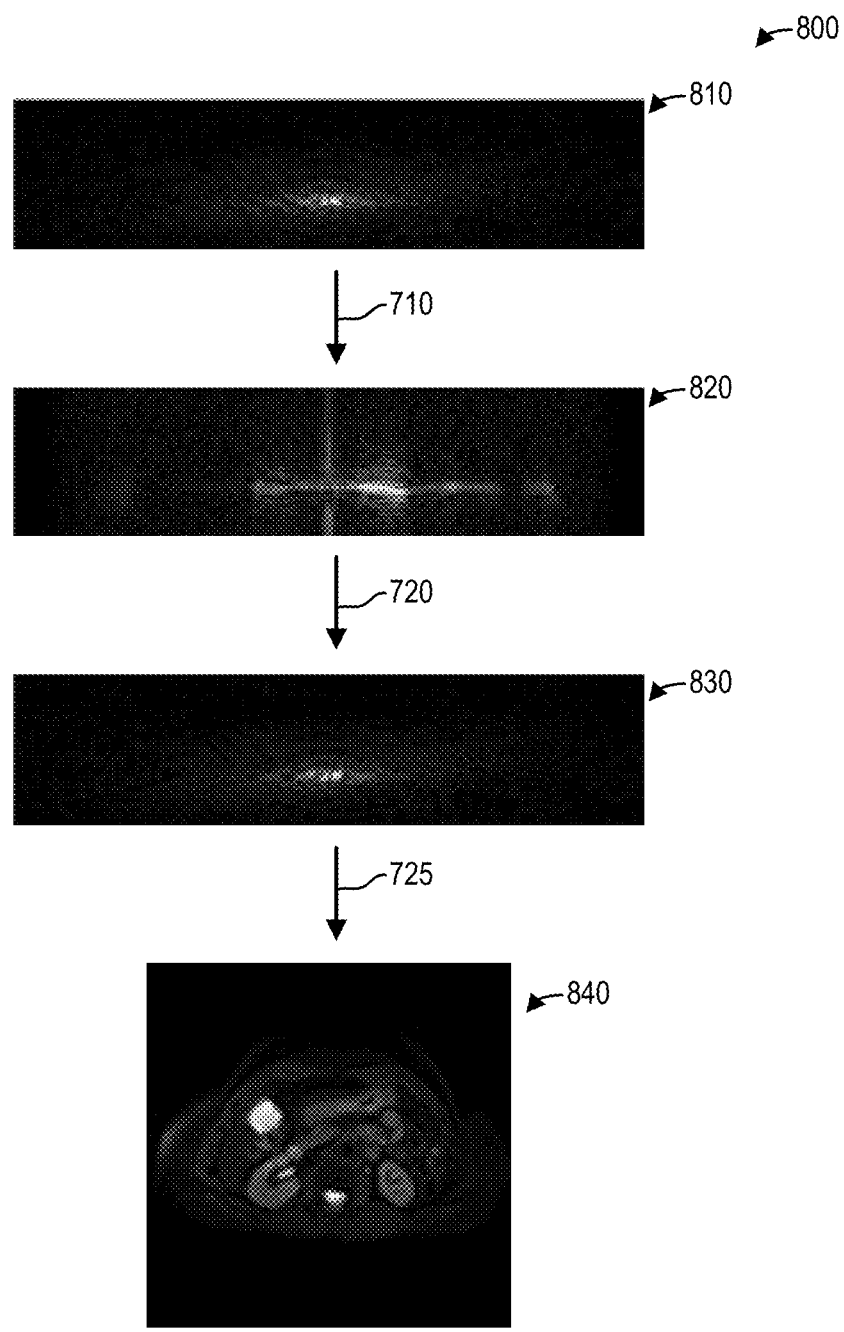
FIG. 8 shows a set of images illustrating an implementation of the method of FIG. 7.
Figure 11:
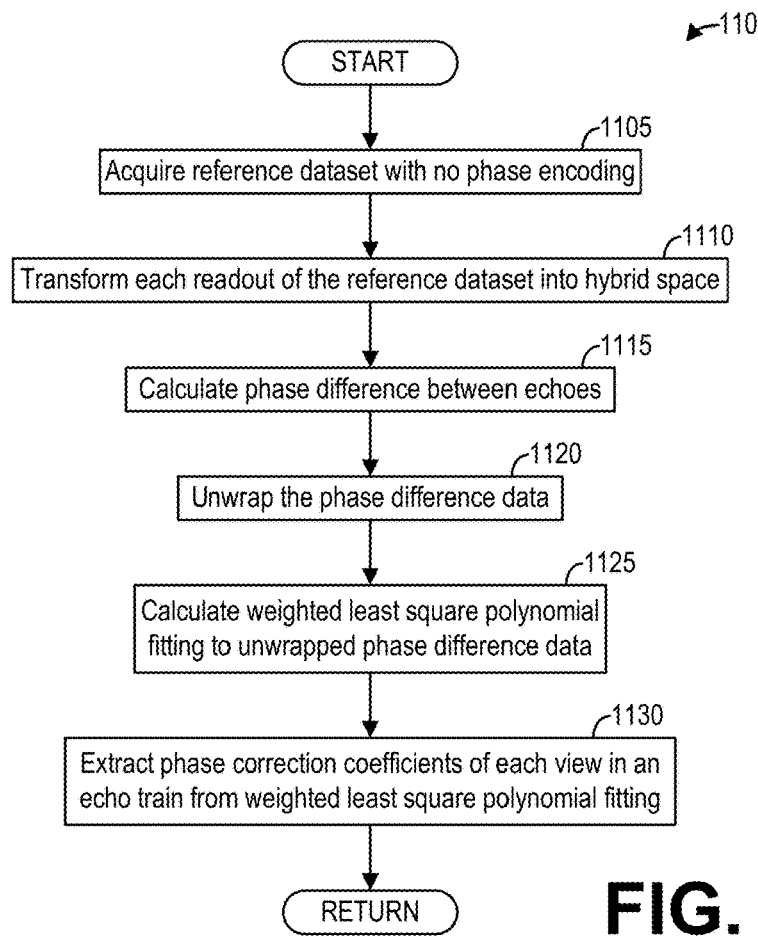
FIG. 11 shows a high-level flow chart illustrating another example method for determining phase corrections between echoes in fast spin echo (FSE) scans according to an embodiment.
Figure 12:
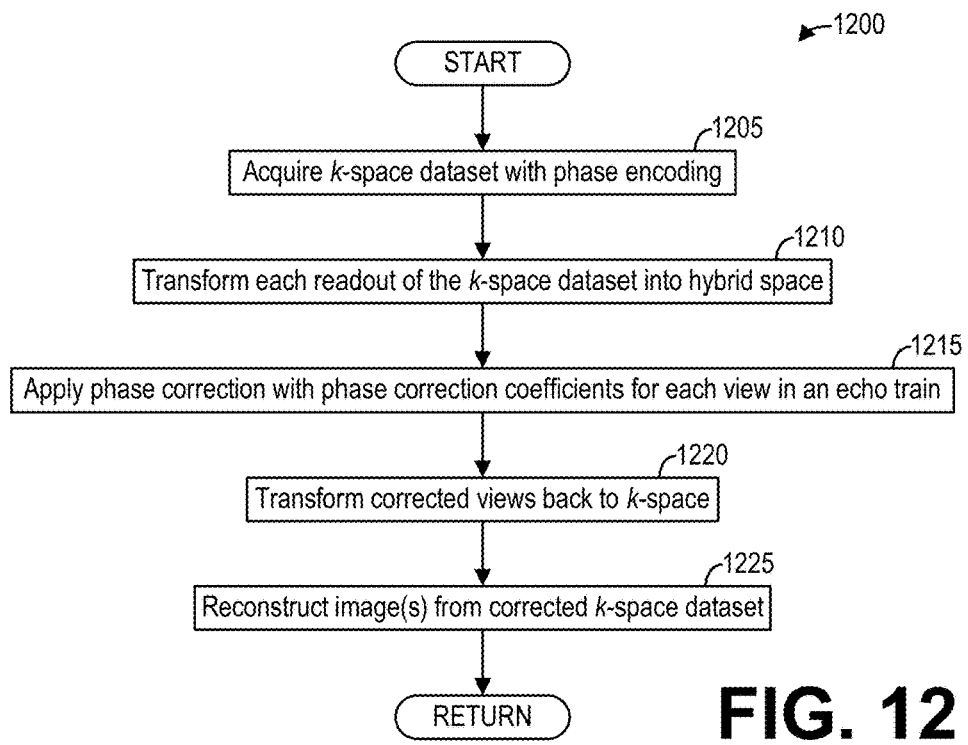
FIG. 12 shows a high-level flow chart illustrating an example method for reconstructing phase-corrected images with the phase corrections of FIG. 11 according to an embodiment.
Figure 13:
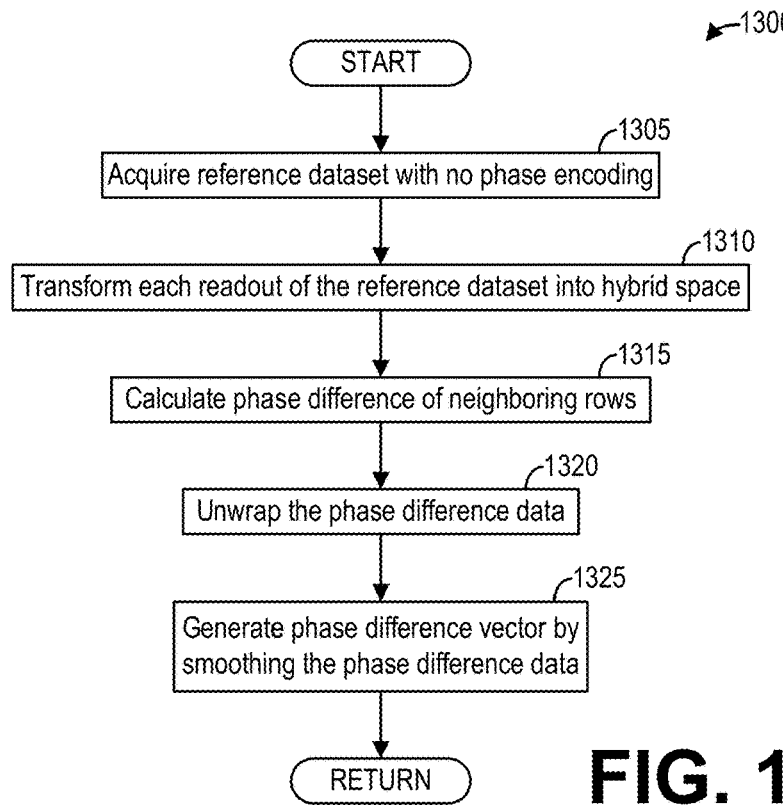
FIG. 13 shows a high-level flow chart illustrating an example method for determining phase correction coefficients imaging according to an embodiment.
Figure 14:
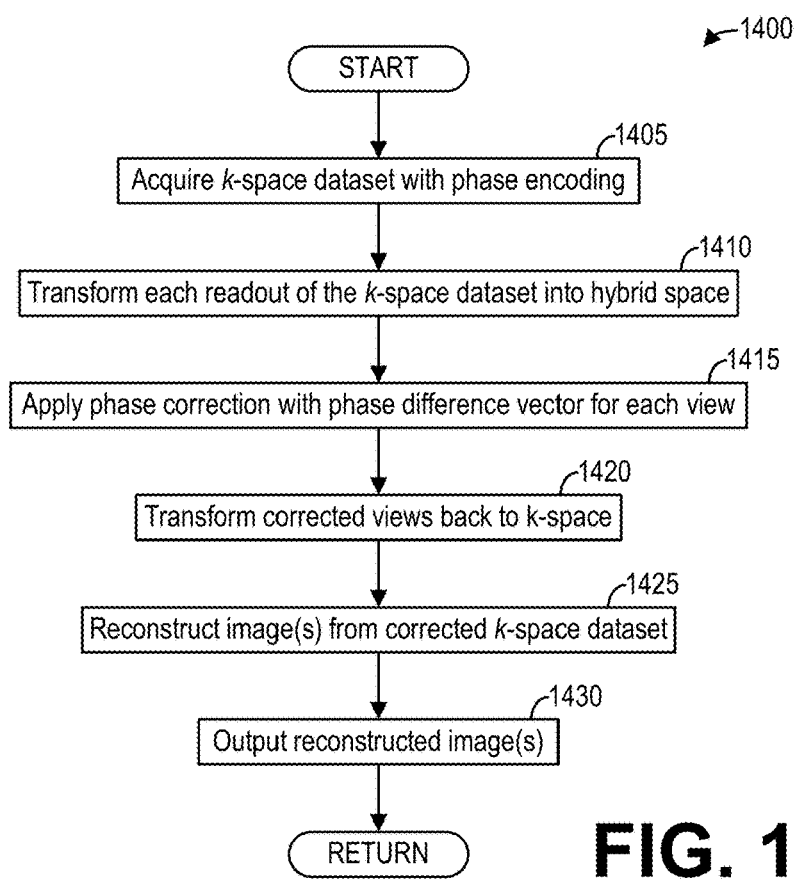
FIG. 14 shows a high-level flow chart illustrating an example method for reconstructing phase-corrected images with the phase corrections determined in FIG. 13 according to an embodiment.

The following description relates to various embodiments of ghost artifact reduction in MRI systems. In particular, systems and methods are provided for reducing ghost artifacts during echo planar imaging (EPI) with an MRI system, such as the MRI system depicted in FIG. 1. During ultrafast MM techniques such as EPI or fast spin echo (FSE), the technique for acquisition of raw k-space data, such as the technique depicted in FIG. 2, may introduce phase errors that cause ghost artifacts in reconstructed images. Such phase errors may be compounded or especially drastic when imaging with a large field of view, such as during body diffusion imaging. A method for reducing ghost artifacts, such as the method depicted in FIG. 3, includes determining phase corrections for phase errors up to a spatial order higher than one from a non-phase encoded reference dataset, and reconstructing images from a phase-encoded k-space dataset corrected with the phase corrections. The source signals that correspond to ghost artifacts may be thus be depicted in phase-corrected images without depicting the ghost artifacts, as depicted in FIG. 4. A method for determining phase corrections, such as the method depicted in FIGS. 5 and 6, includes fitting a cubic polynomial to phase difference data of non-phase-encoded reference data to obtain phase correction coefficients. The phase corrections may then be applied to a phase-encoded k-space dataset, as depicted in FIGS. 7 and 8. The cubic phase correction methods described herein effectively reduce or minimize ghost artifacts, especially in comparison to linear phase correction methods, as depicted in FIGS. 9 and 10. The methods for determining phase corrections and reconstructing phase-corrected images may be implemented with FSE, as depicted in FIGS. 11 and 12. An alternative method for determining phase corrections and reconstructing phase-corrected images may include smoothing phase difference data of a non-phase-encoded reference dataset, as depicted in FIGS. 13 and 14.

Figure 1:
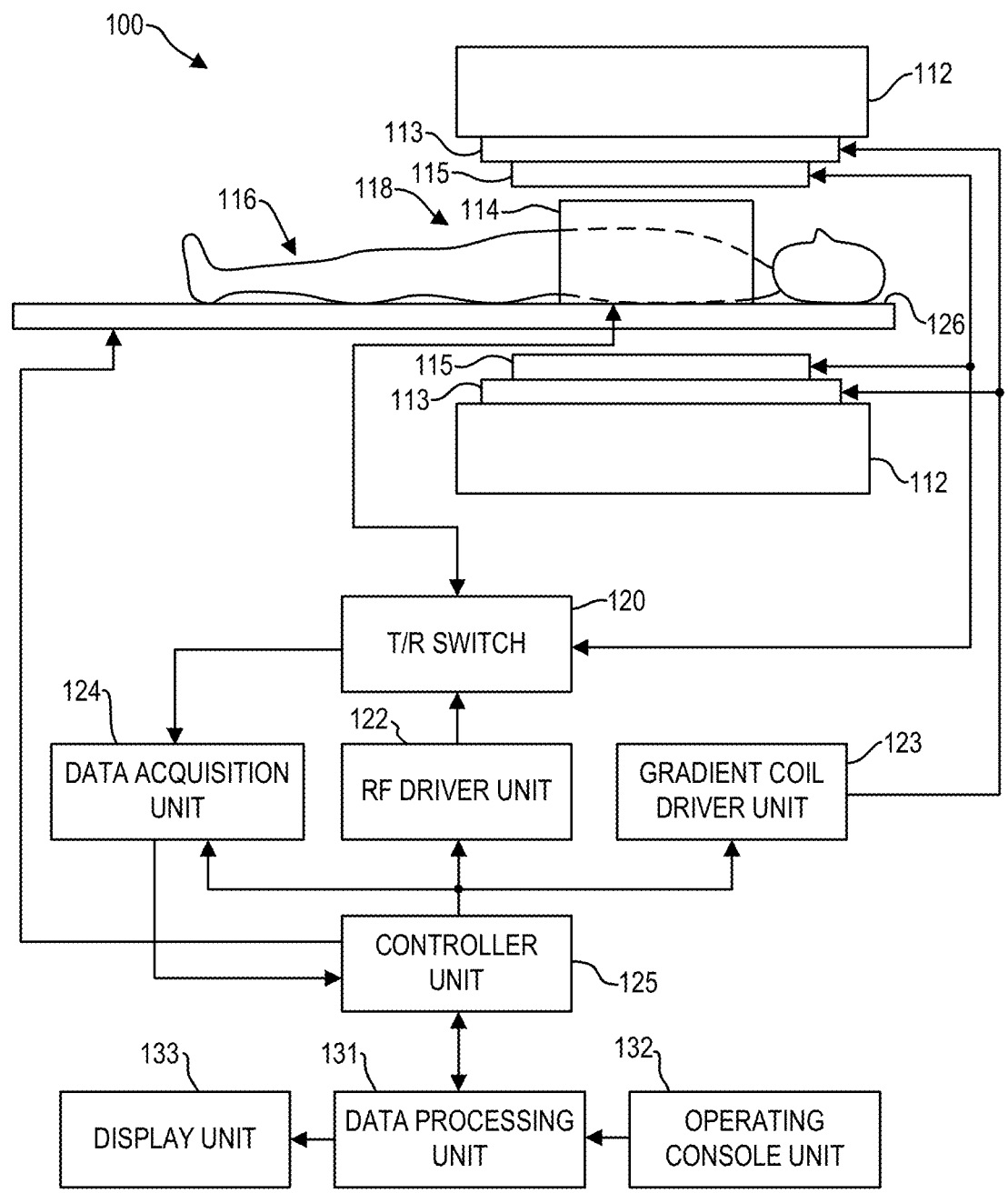
FIG. 1 is a block diagram of an MRI system according to an embodiment.

FIG. 1 illustrates a magnetic resonance imaging (MM) system 100 that includes a magnetostatic field magnet unit 112, a gradient coil unit 113, a radio frequency (RF) coil unit 114, an RF body or volume coil unit 115, a transmit/receive (T/R) switch 120, an RF driver unit 122, a gradient coil driver unit 123, a data acquisition unit 124, a controller unit 125, a patient table or bed 126, a data processing unit 131, an operating console unit 132, and a display unit 133. In one example, the RF coil 114 is a surface coil, which is a local coil that is typically placed proximate to the anatomy of interest of a patient or subject 116. Herein, the RF body coil 115 is a transmit coil that transmits MR signals, and the local surface RF coil 114 receives the MR signals. As such, the transmit body coil (e.g., RF coil unit 115) and the surface receive coil (RF coil unit 114) are independent but electromagnetically coupled structures. The MR system 100 transmits electromagnetic pulse signals to the subject 116 placed in an imaging space 118 with a magnetostatic field formed to perform a scan for obtaining MR signals from the subject 116 to reconstruct an image of a slice of the subject 116 based on the MR signals thus obtained by the scan.

The magnetostatic field magnet unit 112 includes, for example, typically an annular superconducting magnet, which is mounted within a toroidal vacuum vessel. The magnet defines a cylindrical space surrounding the subject 116, and generates a constant primary magnetostatic field along the z direction of the cylinder space.

The MRI system 100 also includes the gradient coil unit 113 that generates a gradient magnetic field in the imaging space 118 so as to provide the MR signals received by the RF coil unit 114 with three-dimensional positional information. The gradient coil unit 113 includes three gradient coil systems, each of which generates a gradient magnetic field, which inclines into one of three spatial axes perpendicular to each other, and generates a gradient field in each of frequency encoding direction, phase encoding direction, and slice selection direction in accordance with the imaging condition. More specifically, the gradient coil unit 113 applies a gradient field in the slice selection direction of the subject 116, to select the slice; and the RF coil unit 114 transmits an RF pulse to a selected slice of the subject 116 and excites it. The gradient coil unit 113 also applies a gradient field in the phase encoding direction of the subject 116 to phase encode the MR signals from the slice excited by the RF pulse. The gradient coil unit 113 then applies a gradient field in the frequency encoding direction of the subject 116 to frequency encode the MR signals from the slice excited by the RF pulse.

The RF coil unit 114 is disposed, for example, to enclose the region to be imaged of the subject 116. In some examples, the RF coil unit 114 may be referred to as the surface coil or the receive coil. In the static magnetic field space or imaging space 118 where a static magnetic field is formed by the magnetostatic field magnet unit 112, the RF coil unit 114 transmits, based on a control signal from the controller unit 125, an RF pulse that is an electromagnetic wave to the subject 116 and thereby generates a high-frequency magnetic field. This excites a spin of protons in the slice to be imaged of the subject 116. The RF coil unit 114 receives, as an MR signal, the electromagnetic wave generated when the proton spin thus excited in the slice to be imaged of the subject 116 returns into alignment with the initial magnetization vector. The RF coil unit 114 may transmit and receive an RF pulse using the same RF coil.

The RF coil body unit 115 is disposed, for example, to enclose the imaging space 118, and produces RF magnetic field pulses orthogonal to the main magnetic field produced by the magnetostatic field magnet unit 112 within the imaging space 118 to excite the nuclei. In contrast to the RF coil unit 114, which may be easily disconnected from the MRI system 100 and replaced with another RF coil unit, the RF body coil unit 115 is fixedly attached and connected to the MRI system 100. Furthermore, whereas local coils such as those comprising the RF coil unit 114 can transmit to or receive signals from only a localized region of the subject 116, the RF body coil unit 115 generally has a larger coverage area or field of view (FOV). The RF body coil unit 115 may be used to transmit or receive signals to the whole body of the subject 116, for example. Using receive-only local coils and transmit body coils provides a uniform RF excitation and good image uniformity at the expense of high RF power deposited in the subject. For a transmit-receive local coil, the local coil provides the RF excitation to the region of interest and receives the MR signal, thereby decreasing the RF power deposited in the subject. It should be appreciated that the particular use of the RF coil unit 114 and/or the RF body coil unit 115 depends on the imaging application.

The T/R switch 120 can selectively electrically connect the RF body coil unit 115 to the data acquisition unit 124 when operating in a receive mode, and to the RF driver unit 122 when operating in a transmit mode. Similarly, the T/R switch 120 can selectively electrically connect the RF coil unit 114 to the data acquisition unit 124 when the RF coil unit 114 operates in receive mode, and to the RF driver unit 124 when operating in transmit mode. When the RF coil unit 114 and the RF body coil unit 115 are both used in a single scan, for example if the RF coil unit 114 is configured to receive MR signals and the RF body coil unit 115 is configured to transmit RF pulses, then the T/R switch 120 may direct control signals from the RF driver unit 122 to the RF body coil unit 115 while directing received MR signals from the RF coil unit 114 to the data acquisition unit 124. The coils of the RF body coil unit 115 may be configured to operate in a transmit-only mode, a receive-only mode, or a transmit-receive mode. The coils of the local RF coil unit 114 may be configured to operate in a transmit-receive mode or a receive-only mode.

The RF driver unit 122 includes a gate modulator (not shown), an RF power amplifier (not shown), and an RF oscillator (not shown) that are used to drive the RF coil unit 114 and form a high-frequency magnetic field in the imaging space 118. The RF driver unit 122 modulates, based on a control signal from the controller unit 125 and using the gate modulator, the RF signal received from the RF oscillator into a signal of predetermined timing having a predetermined envelope. The RF signal modulated by the gate modulator is amplified by the RF power amplifier and then output to the RF coil unit 114.

The gradient coil driver unit 123 drives the gradient coil unit 113 based on a control signal from the controller unit 125 and thereby generates a gradient magnetic field in the imaging space 118. The gradient coil driver unit 123 includes three systems of driver circuits (not shown) corresponding to the three gradient coil systems included in the gradient coil unit 113.

The data acquisition unit 124 includes a preamplifier (not shown), a phase detector (not shown), and an analog/digital converter (not shown) used to acquire the MR signals received by the RF coil unit 114 and/or RF body coil unit 115. In the data acquisition unit 124, the phase detector phase detects, using the output from the RF oscillator of the RF driver unit 122 as a reference signal, the MR signals received from the RF coil unit 114 and/or the RF body coil unit 115 and amplified by the preamplifier, and outputs the phase-detected analog MR signals to the analog/digital converter for conversion into digital signals. The digital signals thus obtained are output to the data processing unit 131.

The MRI system 100 includes a table 126 for placing the subject 116 thereon. The subject 116 may be moved inside and outside the imaging space 118 by moving the table 126, for example along the y direction, based on control signals from the controller unit 125.

The controller unit 125 includes a computer and a non-transitory recording medium on which a program or executable instructions to be executed by the computer is recorded. The program or executable instructions when executed by the computer causes various parts of the MRI system 100 to carry out operations corresponding to pre-determined scanning. The recording medium may comprise, for example, a ROM, flexible disk, hard disk, optical disk, magneto-optical disk, CD-ROM, or non-volatile memory card. The controller unit 125 is connected to the operating console 132 and processes the operation signals input to the operating console unit 132 and furthermore controls the table 126, the RF driver unit 122, the gradient coil driver unit 123, and the data acquisition unit 124 by outputting control signals to them. The controller unit 125 also controls, to obtain a desired image, the data processing unit 131 and the display unit 133 based on operation signals received from the operation console unit 132.

The operating console unit 132 includes user input devices such as, for example, a keyboard and a mouse. The operating console unit 132 is used by an operator of the MRI system 100, for example, to input such data as an imaging protocol and to set a region where an imaging sequence is to be executed. The data about the imaging protocol and the imaging sequence execution region are output to the controller unit 125.

The data processing unit 131 includes a computer and a recording medium on which a program or executable instructions to be executed by the computer to perform predetermine data processing is recorded. The data processing unit 131 is connected to the controller unit 125 and performs data processing based on control signals received from the controller unit 125. The data processing unit 131 is also connected to the data acquisition unit 124 and generates spectrum data by applying various image processing operations to the MR signals output from the data acquisition unit 124.

The display unit 133 comprises a display device and displays an image on a display screen of the display device based on control signals received from the controller unit 125. The display unit 133 displays, for example, an image regarding an input item about which the operator inputs operation data from the operating console unit 132. The display unit 133 also displays a slice image of the subject 116 generated by the data processing unit 131.

Figure 2:
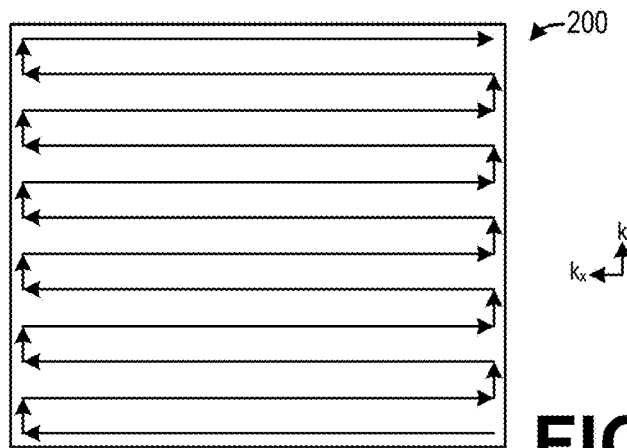
FIG. 2 shows an example k-space acquisition during echo planar imaging according to an embodiment.

For echo planar imaging (EPI), the technique for acquiring data and filling k-space may introduce phase errors. For example, FIG. 2 shows an example k-space acquisition sequence 200 during echo planar imaging according to an embodiment. After a single RF pulse is applied, k-space is filled by acquiring a line or row of k-space is acquired from right to left along the readout direction or the $k_x$ direction, the next row of k-space is acquired from left to right along the readout direction, the next row of k-space is acquired from right to left, and so on, as depicted. Since phase encoding is typically applied along the vertical axis (e.g., the $k_y$ direction), phase corrections may be determined by examining errors in a reference dataset acquired without phase encoding, as described further herein. The methods described herein below relate to correcting such phase errors in order to reduce or minimize ghost artifacts in reconstructed images.

Figure 3:
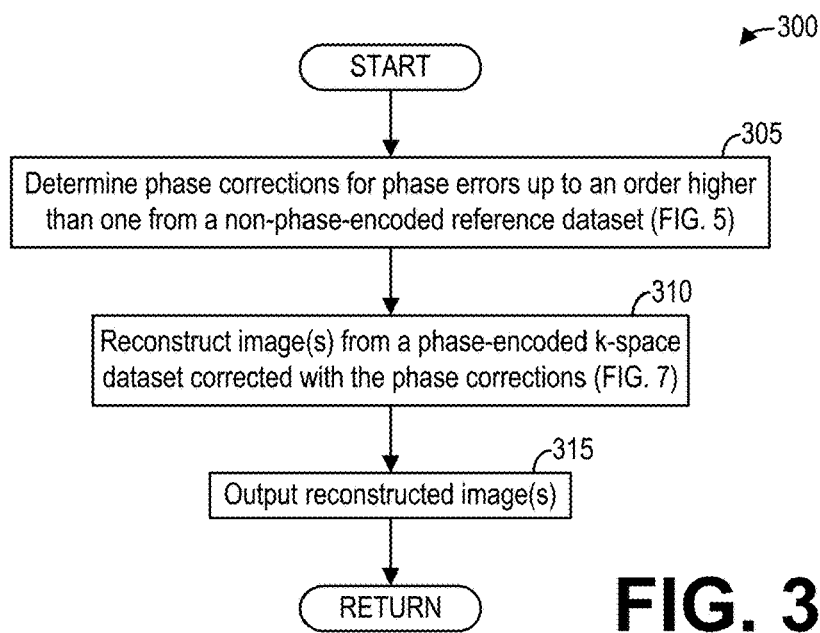
FIG. 3 shows a high-level flow chart illustrating an example method for reducing ghost artifacts according to an embodiment.
Figure 4A:
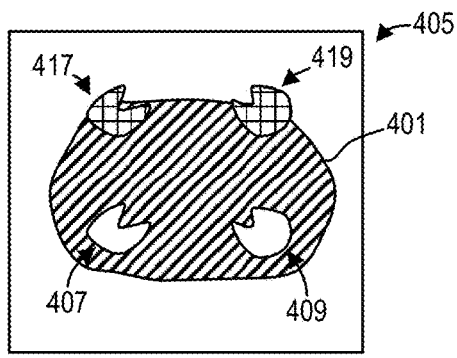
FIG. 4A shows a schematic image with ghost artifacts according to an embodiment.
Figure 4B:
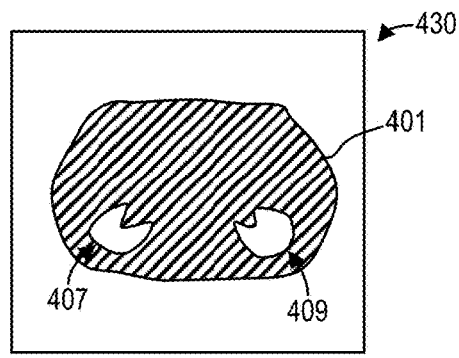
FIG. 4B shows a schematic image with ghost artifacts being reduced from the image of 4A according to an embodiment.

FIG. 3 shows a high-level flowchart illustrating an example method 300 for reducing ghost artifacts according to an embodiment. In particular, method 300 relates to correcting higher-order phase errors that may cause ghost artifacts in a reconstructed image. Method 300 is described with regard to the systems and components of FIG. 1, though it should be appreciated that the method may be implemented with other systems and components without departing from the scope of the present disclosure. Method 300 may be implemented as executable instructions in non-transitory memory and executed by a processor. For example, method 300 may be implemented as executable instructions in non-transitory memory of the data processing unit 131 of the MRI system 100.

Method 300 begins at 305. At 305, method 300 determines phase corrections for phase errors up to a spatial order higher than one. Method 300 determines the phase corrections from a non-phase-encoded reference dataset. The non-phase-encoded reference dataset comprises MR data acquired without phase encoding. In one example, method 300 determines the phase corrections for phase errors up to a third order. That is, in addition to a constant phase correction and a linear phase correction, method 300 also determines a cubic phase correction and optionally a quadratic phase correction. An example method for determining phase corrections, described further herein with regard to FIGS. 5 and 6, includes performing a reference scan without phase encoding to acquire a non-phase-encoded reference dataset, and determining constant, linear, quadratic, and cubic phase corrections from the reference data. While the method described herein with regard to FIGS. 5 and 6 relates specifically to echo planar imaging (EPI), it should be appreciated that the method may also be implemented with other types of MRI. For example, the method may be adapted to fast spin echo (FSE) imaging techniques, as described further herein with regard to FIG. 11.

Furthermore, in some examples, method 300 may determine phase corrections without specifically determining phase correction coefficients. For example, as described further herein with regard to FIG. 13, method 300 may obtain phase corrections by smoothing phase differences between neighboring rows of non-phase-encoded reference data.

Referring again to FIG. 3, method 300 continues to 310 after determining phase corrections for higher-order phase errors. At 310, method 300 reconstructs one or more image(s) with a phase-encoded k-space dataset corrected with the phase corrections. An example method for reconstructing phase-corrected images, such as the method described further herein with regard to FIG. 7, includes applying the phase corrections to image data acquired with phase encoding, and reconstructing the phase-corrected image data into the one or more images. The phase corrections are applied to each view of the image data. As discussed above, the method of FIG. 7 is described with regard to EPI, though it should be appreciated that the method may be implemented with other MRI techniques such as FSE. As an example, a method for reconstructing phase-corrected images acquired using FSE techniques, such as the method described further herein with regard to FIG. 12, includes applying phase corrections for each view in an echo train.

Furthermore, in examples wherein phase corrections are determined by smoothing phase differences between views, a method for reconstructing phase-corrected images, such as the method described herein with regard to FIG. 14, includes applying phase corrections according to a phase difference vector constructed from the smoothed phase difference data to phase-encoded image data.

Referring again to FIG. 3, method 300 continues to 315 after reconstructing the one or more images. At 315, method 300 outputs the one or more reconstructed image(s). The one or more reconstructed images may be output, for example, to a display unit such as display unit 133 for display. The one or more reconstructed images displayed include fewer ghost artifacts or ghosting signals caused by phase errors, thereby improving the ability for a physician or other user to provide an accurate diagnosis based on the displayed images. Additionally or alternatively, the one or more reconstructed images may be output to a local non-transitory memory of the MRI system 100 or a picture archiving and communication system (PACS) communicatively coupled to the MRI system 100. Method 300 then ends.

Thus, a method for reducing ghost artifacts in reconstructed images includes determining phase corrections for higher-order phase errors with non-phase-encoded reference data and correcting phase-encoded imaging data with the phase corrections. As an illustrative and non-limiting example, FIG. 4 shows a set of images 400 including an example uncorrected image 405 and an example corrected image 430. As depicted in the uncorrected image 405 of a body 401, the uncorrected image 405 may include one or more source signals, such as source signals 407 and 409, and higher-order phase errors in the imaging data may result in one or more ghost artifacts, such as ghost artifacts 417 and 419, appearing in the uncorrected image 405. The ghost artifacts 417 and 419 are positioned away from the source signals 407 and 409, and thus may be incorrectly interpreted by a person reviewing the uncorrected image 405 as structures actually existing in the body 401.

By correcting the phase errors as described herein, a corrected image such as corrected image 430 of the body 401 may be reconstructed that depicts the source signals 407 and 409 without also depicting the ghost artifacts 417 and 419. In this way, a physician may review the internal anatomy of a patient without mistaking a ghost artifact for a lesion or another structure within the anatomy, thereby improving a diagnosis made by the physician.

Figure 5:
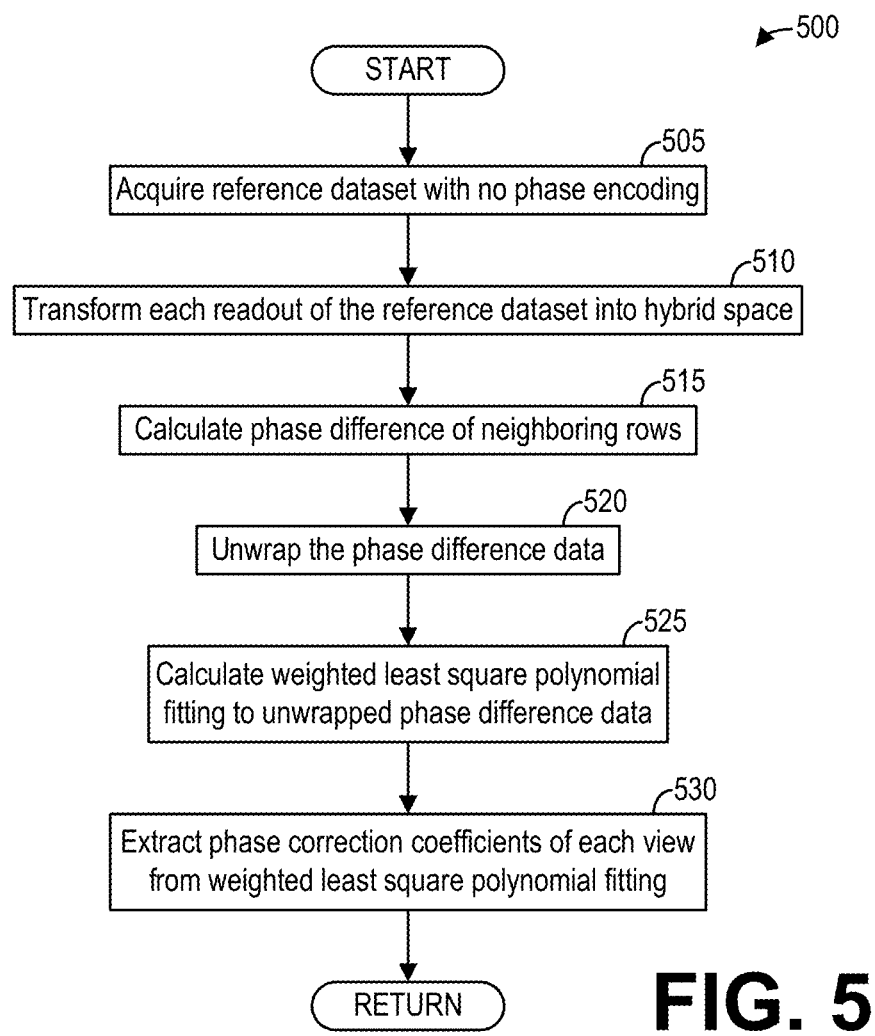
FIG. 5 shows a high-level flow chart illustrating an example method for determining phase correction coefficients according to an embodiment.

FIG. 5 shows a high-level flow chart illustrating an example method 500 for determining phase correction coefficients according to an embodiment. In particular, method 500 relates to calculating phase correction coefficients from non-phased-encoded reference data acquired according to EPI techniques. Method 500 is described with reference to the systems and components of FIG. 1, though it should be appreciated that the method may be implemented with other systems and components without departing from the scope of the present disclosure. Method 500 may be implemented, for example, as executable instructions in non-transitory memory of a computing device, such as data processing unit 131 of the MRI system 100.

Method 500 begins at 505. At 505, method 500 acquires a reference dataset with no phase encoding. To that end, method 500 controls the gradient coil unit 113 as well as the RF coil unit 114 and/or the RF body coil unit 115 to acquire a reference dataset, wherein the gradient coil unit 113 is controlled to not generate a phase encoding gradient during the acquisition. The reference dataset thus comprises a non-phase-encoded reference dataset.

At 510, method 500 transforms each readout of the reference data into image space, for example by applying a Fourier transform to each readout of the reference data. Method 500 may transform each readout along the readout direction, for example, depicted as the $k_x$ direction in FIG. 2.

At 515, method 500 calculates a phase difference of neighboring rows. To that end, method 500 multiplies each readout or row with the complex conjugate of the next readout or row. Thus, for N rows of input data, method 200 produces N−1 rows of phase difference data. Continuing at 520, method 500 unwraps the phase difference data calculated at 515. To unwrap the phase difference data, method 500 may use, for example, Ahn-Cho unwrapping method, as described in Ahn C B, Cho Z H. A New Phase Correction Method in NMR Imaging Based on AutoCorrelation and Histogram Analysis. IEEE Transactions on Medical Imaging. VOL MI-6, No. 1. 1987-March].

At 525, method 500 calculates a weighted least square polynomial fitting to the unwrapped phase difference data. For example, method 500 may calculate the weighted least squares polynomial fitting by minimizing the mean square error $R^2$ of the estimated data with the measured data:

$$R^2 = \Sigma_{i=0}^{n}(W_i^*(y_i - \Sigma_{k=0}^{m} a_k x_i^k))^2,$$

where the order m indicates a linear fitting when m=1 and a cubic fitting when m=3, $W_i$ is the fitting weight of a data point, and $a_k$ is a polynomial coefficient. An example weighting for $W_i$ is the magnitude of the data. Method 500 calculates the weighted least squares polynomial fitting to a spatial order higher than linear or first order. For example, method 500 may calculate the weighted least squares polynomial fitting to a third order or cubic order, such that m equals three. Thus, the weighted least squares polynomial fitting includes a constant term (i.e., a zeroth-order term), a linear term (i.e., a first-order term), a quadratic term (i.e., a second-order term), and a cubic term (i.e., a third-order term).

At 530, method 500 extracts phase correction coefficients of each view from the weighted least square polynomial fitting. In particular, the phase correction coefficients may correspond to the polynomial coefficients $\alpha_k$ described hereinabove. The phase correction coefficients thus comprise phase corrections that may be applied to a phase-encoded k-space dataset to correct phase errors in the phase-encoded k-space dataset, as described further herein with regard to FIG. 7. Method 500 then returns.

Figure 6:
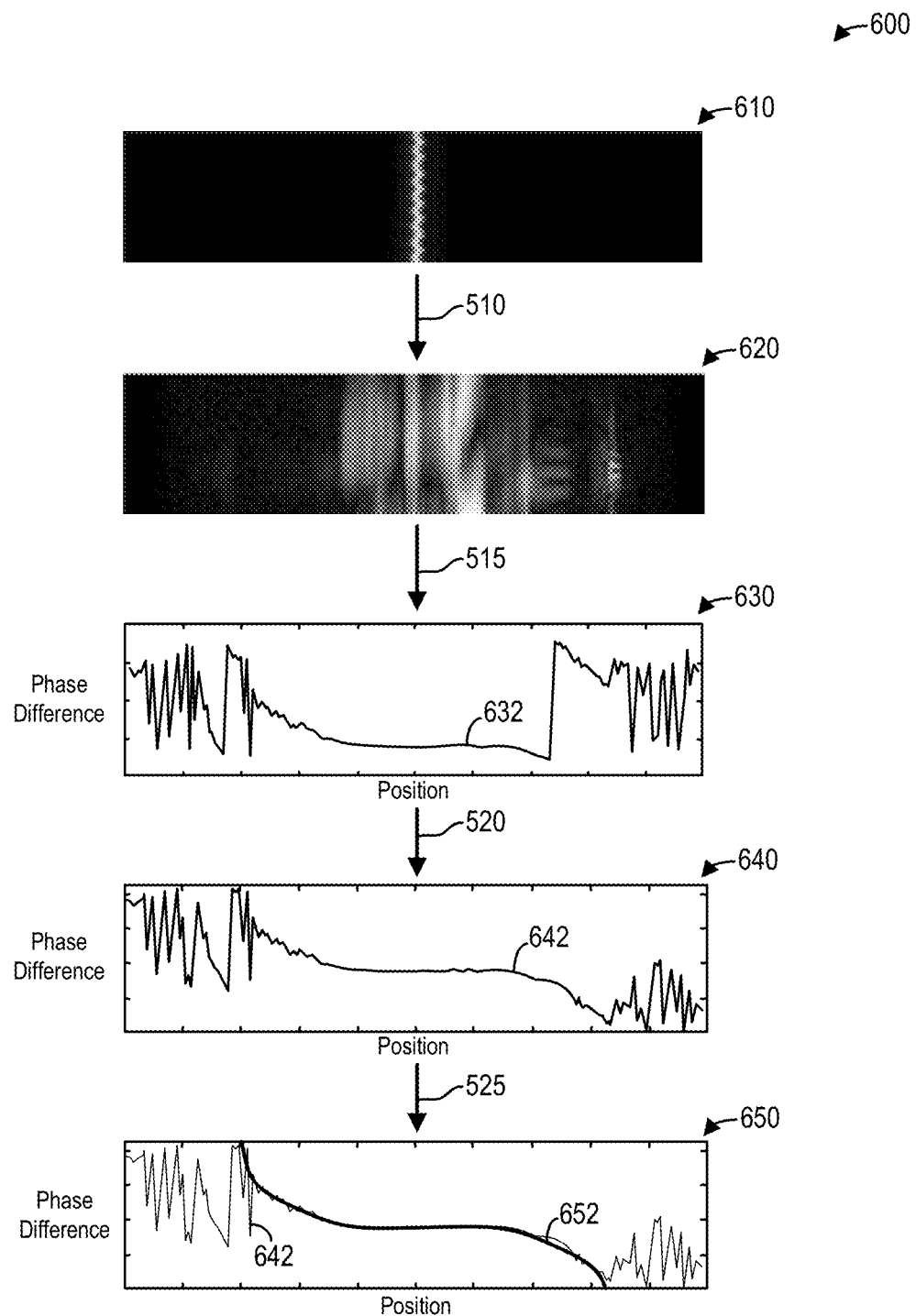
FIG. 6 shows a set of images illustrating an implementation of the method of FIG. 5.

As an illustrative example, FIG. 6 shows a set of images and graphs illustrating an example method 600 corresponding to the method 500 for determining phase correction coefficients according to an embodiment. Specifically, method 600 includes acquisition of a non-phase-encoded reference dataset, depicted by the image 610 depicting the reference dataset in k-space. Method 600 transforms the non-phase-encoded reference dataset into image space at 510, and so image 620 depicts the reference dataset in hybrid space. Method 600 calculates the phase difference between neighboring rows at 515, and so graph 630 depicts the phase difference data 632 as a function of position. As depicted, the phase difference data 632 is generally linear as a function of position near the center, while substantial phase differences are observed to the left and the right of the center position. After unwrapping the phase difference data at 520 to obtain the unwrapped phase difference data 642 depicted in graph 640, method 600 calculates a polynomial fit to the unwrapped phase difference data 642 at 525. As depicted by graph 650, a cubic polynomial fitting 652 effectively fits the unwrapped phase difference data 642.

It should be noted that although view-by-view measurement and correction in the reference scan is described in detail above, variations are contemplated herein. For example, in some embodiments, a composite odd-even phase difference is obtained by taking the complex sum of the view-by-view phase difference, or by selecting central views that represent the phase errors in the entire acquisition.

FIG. 7 shows a high-level flow chart illustrating an example method 700 for reconstructing a phase-corrected image according to an embodiment. In particular, method 700 relates to applying phase corrections to a phase-encoded k-space dataset with the phase correction coefficients described hereinabove with regard to FIG. 5, and reconstructing an image from the phase-corrected phase-encoded k-space dataset. Method 700 is described herein with reference to the systems and components of FIG. 1, though it should be appreciated that the method 700 may be implemented with other systems and components without departing from the scope of the present disclosure. Method 700 may be implemented as executable instructions in non-transitory memory of a computing device, such as data processing unit 131 of the MRI system 100.

Method 700 begins at 705. At 705, method 700 acquires a k-space dataset with phase encoding. To that end, method 700 controls the gradient coil unit 113 as well as the RF coil unit 114 and/or the RF body coil unit 115 to acquire an k-space dataset, wherein the gradient coil unit 113 is controlled to generate a phase-encoding gradient. The k-space dataset thus comprises a phase-encoded k-space dataset.

At 710, method 700 transforms each readout of the k-space dataset into image space, for example by applying an inverse fast Fourier transform to each readout of the k-space dataset. Continuing at 715, method 700 applies a phase correction for each view with the phase correction coefficients. The phase correction coefficients are applied in the $(x, k_y)$ hybrid space, taking advantage of the Fourier phase shift theorem. At 720, method 700 transforms the corrected views back to k-space, for example by applying a fast Fourier transform. After applying the coefficients in $(x, k_y)$ space and transforming back to $(k_x, k_y)$ space, the phase-corrected k-space dataset in k-space is properly aligned.

Continuing at 725, method 700 reconstructs one or more images from the corrected k-space data or the corrected k-space dataset. The one or more images reconstructed from the phase-corrected k-space dataset include fewer ghost artifacts than an image reconstructed directly from the k-space dataset acquired at 705 without phase correction. Method 700 then returns.

As an illustrative example of method 700, FIG. 8 shows a set of images 800 depicting an example method 800 corresponding to the method 700 for reconstructing phase-corrected images according to an embodiment. In particular, the image 810 depicts an k-space dataset with phase encoding in k-space. The image 820 depicts the k-space dataset after transforming each readout of the phase-encoded k-space dataset into hybrid space at 710. After phase-correcting the k-space dataset in image space with the phase correction coefficients, the phase-corrected k-space dataset in image space is transformed back to k-space at 720. The image 830 thus depicts the phase-corrected k-space dataset in k-space. Method 800 then reconstructs the image 840 from the phase-corrected k-space dataset in k-space at 725.

Thus, a method comprises acquiring a phase-encoded k-space dataset, correcting the phase-encoded k-space dataset with the phase corrections in image space, and reconstructing an image from the corrected phase-encoded k-space dataset.

Figure 9A:
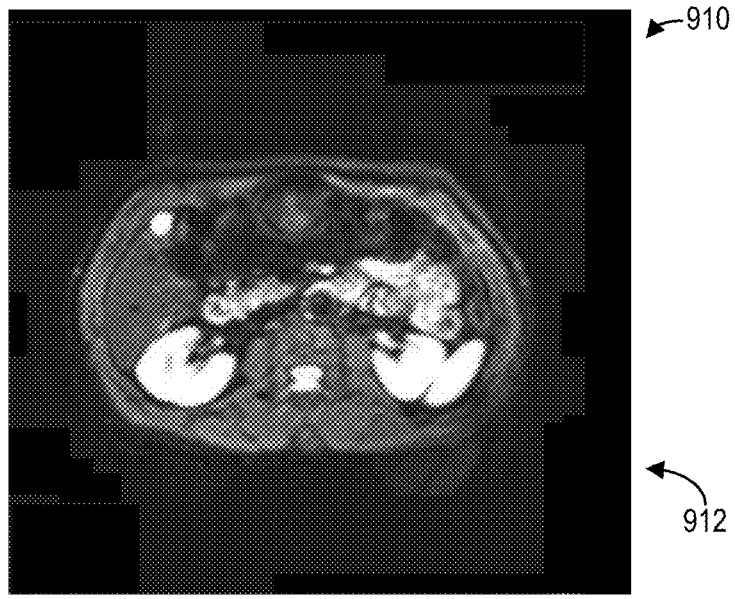
FIG. 9A shows an image with ghost artifacts positioned outside an imaged subject according to an embodiment.
Figure 9B:
FIG. 9B shows an image with ghost artifacts being reduced from the image of FIG. 9A according to an embodiment.

To illustrate the efficacy of the methods described herein for reducing ghost artifacts, FIGS. 9A and 9B show an example set of body diffusion images including a linear phase-corrected image 910 and a cubic phase-corrected image 920. The linear phase-corrected image 910 and the cubic phase-corrected image 920 are reconstructed from a same phase-encoded k-space dataset, however the linear phase-corrected image 910 is reconstructed with linear phase corrections while the cubic phase-corrected image 920 is reconstructed with cubic phase corrections applied to the phase-encoded k-space dataset. As a result, the linear phase-corrected image 910 includes a ghost artifact 912 positioned below and corresponding to the bright anatomical structure observable in the lower right portion of the subject, as depicted. As the cubic phase-corrected image 920 is reconstructed with cubic phase corrections applied to the phase-encoded k-space dataset, the cubic phase-corrected image 920 does not include the ghost artifact 912 visible in the uncorrected image 910. It should be appreciated that the large field of view depicted in both the linear phase-corrected image 910 and the cubic phase-corrected image 920 is at least partially responsible for the ghost artifact 912, and so merely applying a linear phase correction to the phase-encoded k-space dataset does not minimize or reduce the ghost artifact 912. However, the cubic phase corrections effectively remove the ghost artifact 912 altogether from the cubic phase-corrected image 920.

Figure 10A:
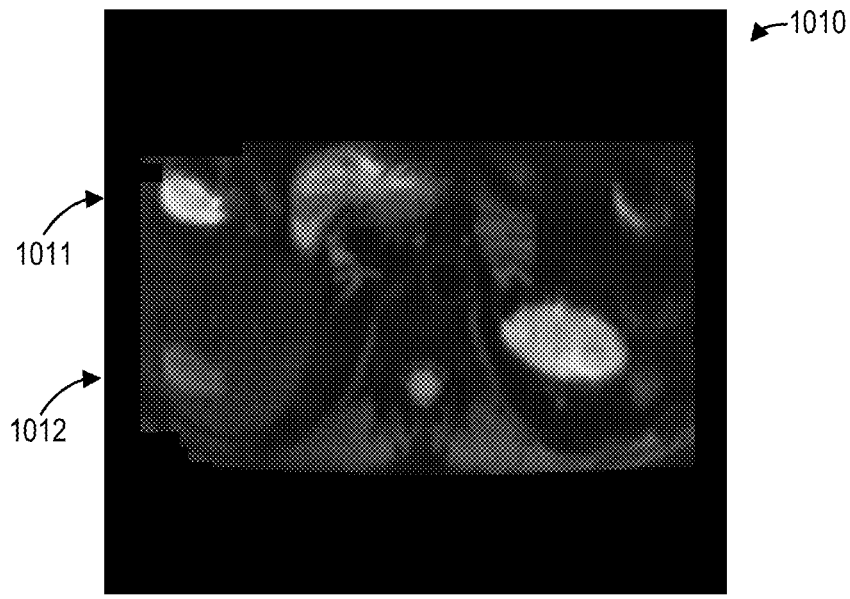
FIG. 10A shows an image with ghost artifacts positioned within an imaged subject according to an embodiment.
Figure 10B:
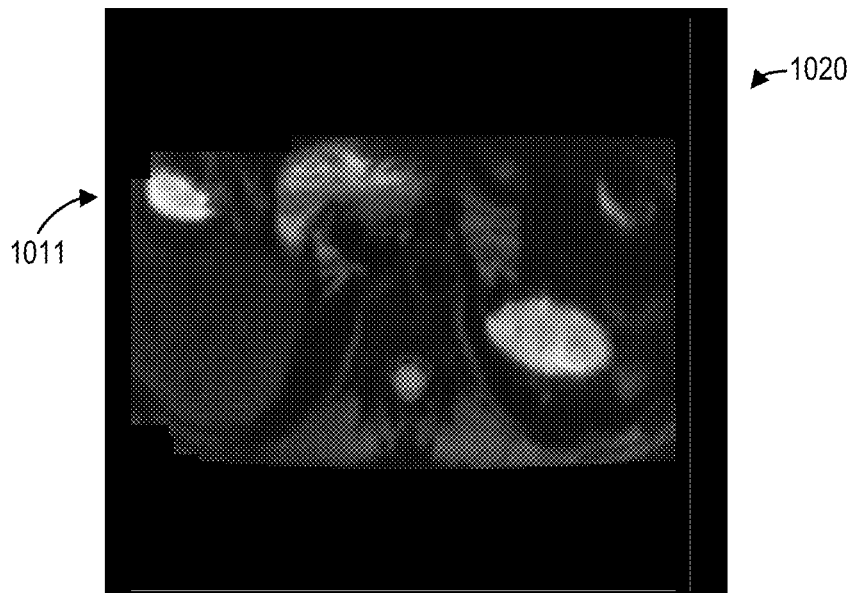
FIG. 10B shows an image with ghost artifacts being reduced from the image of FIG. 10A according to an embodiment.

As another illustrative example, FIGS. 10A and 10B show another example set of body diffusion images including a linear phase-corrected image 1010 and a high-order (e.g., cubic) phase-corrected image 1020. The linear phase-corrected image 1010 includes a ghost artifact 1012 corresponding to the source signal 1011. In contrast with ghost artifact 912 in the linear phase-corrected image 910 discussed hereinabove, the ghost artifact 1012 in the linear phase-corrected image 1010 is positioned within the subject. A physician, for example, may incorrectly interpret the ghost artifact 1012 in the linear phase-corrected image 1010 as a lesion, for example, which may result in an incorrect diagnosis and/or an unnecessary invasive procedure such as a biopsy. However, due to the application of cubic phase corrections rather than (or in addition to) linear phase corrections to the phase-encoded k-space dataset, the cubic phase-corrected image 1020 depicts the source signal 1011 but does not depict the ghost artifact 1012. The systems and methods described herein thus provide a substantial and critical technical improvement over previous methods for ghost artifact reduction.

In addition to reducing artifacts for EPI and in particular diffusion-weighted (DW) EPI, the methods and systems described herein may be easily modified to correct phase errors (and thus reduce ghost artifacts) for similar ultrast MRI techniques. As an example, FIG. 11 shows a high-level flow chart illustrating an example method 1100 for determining phase correction coefficients for fast spin echo (FSE) imaging according to an embodiment. In particular, method 1100 relates to calculating phase correction coefficients according to an echo train. Method 1100 is described with regard to the systems and components of FIG. 1, though it should be appreciated that the method 1100 may be implemented with other systems and components without departing from the scope of the present disclosure. Method 1100 may be implemented as executable instructions in non-transitory memory of a computing device, such as data processing unit 131 of the MRI system 100.

Method 1100 begins at 1105. At 1105, method 1100 acquires reference data with no phase encoding. Method 1100 controls the gradient coil unit 113 as well as the RF coil unit 114 and/or the RF body coil unit 115 to acquire the reference dataset, wherein the gradient coil unit 113 is controlled to not generate a phase encoding gradient during the acquisition of the reference dataset. The reference dataset thus comprises a non-phase-encoded reference dataset.

At 1110, method 1100 transforms each readout of the reference data into hybrid space, for example by applying an inverse fast Fourier transform to each readout along the readout direction (e.g., the $k_x$ direction). Continuing at 1115, method 1100 calculates a phase difference between echoes by multiplying an echo by the complex conjugate of a succeeding echo. The phase difference step thus is modified for FSE data acquisition with consideration of the view acquisition order. At 1120, method 1100 unwraps the phase difference data. At 1125, method 1100 calculates a weighted least square polynomial fitting to the unwrapped phase difference data, as discussed hereinabove. Finally, at 1130, method 1100 extracts phase correction coefficients for each view in the echo train from the weighted least square polynomial fitting. Method 1100 then returns.

FIG. 12 shows a high-level flow chart illustrating an example method 1200 for reconstructing phase-corrected images for FSE imaging according to an embodiment. In particular, method 1200 relates to applying phase corrections for each view in an echo train and reconstructing phase-corrected images. Method 1200 is described with regard to the systems and components of FIG. 1, though it should be appreciated that the method 1200 may be implemented or carried out by other systems and components without departing from the scope of the present disclosure. Method 1200 may be implemented as executable instructions in non-transitory memory of a computing device, such as the data processing unit 131 of the MM apparatus 100.

Method 1200 begins at 1205. At 1205, method 1200 acquires imaging dataset with phase encoding, for example by controlling the gradient coil unit 113 as well as the RF coil unit 114 and/or the RF body coil unit 115 to acquire the imaging dataset, wherein the gradient coil unit 113 is controlled to generate a phase encoding gradient during the acquisition. At 1210, method 1200 transforms each readout of the imaging data into hybrid space, for example by applying an inverse fast Fourier transform to each readout along the readout direction.

At 1215, method 1200 applies a phase correction with the phase correction coefficients calculated at 1125 for each view in the echo train of the acquisition performed at 1205. To that end, method 1200 may reference an FSE view index table to ensure that the phase correction coefficients are correctly applied.

Continuing at 1220, method 1200 transforms the corrected views back to k-space, for example by applying a fast Fourier transform to the phase-corrected views. At 1225, method 1200 reconstructs one or more image(s) from the phase-corrected k-space dataset. Method 1200 then ends.

FIG. 13 shows a high-level flow chart illustrating another example method 1300 for determining phase corrections according to an embodiment. In particular, method 1300 relates to determining phase corrections by smoothing phase difference data of a non-phase-encoded reference dataset. Method 1300 is described with reference to the systems and components of FIG. 1, though it should be appreciated that the method may be implemented and carried out by other systems and components without departing from the scope of the present disclosure. Method 1300 may be implemented as executable instructions in non-transitory memory of a computing device, such as the data processing unit 131 of the MM system 100.

Method 1300 begins at 1305. At 1305, method 1300 acquires a reference dataset with no phase encoding. To that end, method 1300 controls the gradient coil unit 113 as well as the RF coil unit 114 and/or the RF body coil unit 115 to acquire the reference dataset, wherein the gradient coil unit 113 is controlled to not generate a phase encoding gradient. The acquired reference dataset thus comprises a non-phase-encoded reference dataset from which phase corrections may be determined.

Continuing at 1310, method 1300 transforms each readout of the reference data into hybrid space, for example by applying an inverse fast Fourier transform to each readout along the readout direction (e.g., the $k_x$ direction). At 1315, method 1300 calculates a phase difference of neighboring rows, for example by multiplying each row by the complex conjugate of the next row. At 1320, method 1300 unwraps the phase difference data calculated at 1315. Finally, continuing at 1325 to determine phase corrections, method 1300 generates a phase difference vector by smoothing the phase difference data. For example, the phase difference data may be smoothed using one or more envelopes or otherwise reducing the noise of the phase difference data. Method 1300 then ends.

FIG. 14 shows a high-level flow chart illustrating an example method 1400 for reconstructing phase-corrected images with phase corrections determined according to method 1300. In particular, method 1400 relates to applying phase corrections obtained by smoothing phase difference data to a phase-encoded k-space dataset. Method 1400 is described with reference to the systems and components of FIG. 1, though it should be appreciated that the method 1400 may be implemented and carried out by other systems and components without departing from the scope of the present disclosure. Method 1400 may be implemented as executable instructions in non-transitory memory of a computing device, such as the data processing unit 131 of the Mill system 100.

Method 1400 begins at 1405. At 1405, method 1400 acquires a k-space dataset or imaging data with phase encoding. To that end, method 1400 controls the gradient coil unit 113 as well as the RF coil unit 114 and/or the RF body coil unit 115 to acquire the k-space dataset, wherein the gradient coil unit 113 is controlled to generate a phase encoding gradient. The k-space dataset thus comprises a phase-encoded k-space dataset.

At 1410, method 1400 transforms each readout of the imaging data into image space. Method 1400 may transform each readout along the readout direction (e.g., the $k_x$ direction) using an inverse fast Fourier transform, for example. Continuing at 1415, method 1400 applies a phase correction for each view with the phase difference vector generated at 1325 by smoothing the phase difference data. The phase difference vector may be applied with an alternating sign to account for the 180 degree shift in direction during the acquisition of the k-space dataset.

At 1420, method 1400 transforms the corrected views back to k-space, for example by applying a fast Fourier transform to the corrected views obtained at 1415. Continuing at 1425, method 1400 reconstructs one or more image(s) from the corrected k-space dataset. The one or more images exhibit a substantial reduction or complete elimination of ghost artifacts in comparison to an image reconstructed from the same phase-encoded k-space dataset without phase corrections or even with a linear phase correction. At 1430, method 1400 outputs the one or more reconstructed image(s), for example to a display unit such as display unit 133, to be displayed on a screen of a display device of the display unit 133. Additionally or alternatively, the one or more reconstructed images may be output to non-transitory memory for subsequent retrieval and review. Method 1400 then ends.

A technical effect of the present disclosure is the reduction or elimination of ghost artifacts in reconstructed images. Another technical effect is the acquisition of non-phase-encoded reference data and phase-encoded image data. Yet another technical effect is the correction of higher-order phase errors during ultrafast magnetic resonance imaging. Another technical effect of the present disclosure is the reconstruction and display of images with reduced artifacts and improved image quality.

In one embodiment, a method for an MRI system comprises acquiring a non-phase-encoded reference dataset, calculating phase corrections for spatial orders higher than first order from the non-phase-encoded reference dataset, acquiring a phase-encoded k-space dataset, correcting the phase-encoded k-space dataset with the phase corrections, and reconstructing an image from the corrected phase-encoded k-space dataset.

In a first example of the method, calculating the phase corrections for spatial orders higher than first order from the non-phase-encoded reference dataset comprises calculating phase differences between neighboring rows of the non-phase-encoded reference dataset. In a second example of the method optionally including the first example, calculating the phase corrections for spatial orders higher than first order from the non-phase-encoded reference dataset further comprises calculating a polynomial fit to the calculated phase differences, the polynomial comprising at least a constant term, a linear term, a quadratic term, and a cubic term. In a third example of the method optionally including one or more of the first and second examples, calculating the polynomial fit to the calculated phase differences comprises calculating a weighted least squares fitting to the calculated phase differences. In a fourth example of the method optionally including one or more of the first through third examples, the phase corrections comprise coefficients of the constant term, the linear term, the quadratic term, and the cubic term. In a fifth example of the method optionally including one or more of the first through fourth examples, calculating the phase corrections for spatial orders higher than first order from the non-phase-encoded reference dataset further comprises smoothing the calculated phase differences to generate a phase correction vector, wherein correcting the phase-encoded k-space dataset with the phase corrections comprises applying the phase correction vector to each view in the phase-encoded k-space dataset with an alternating sign from view to view. In a sixth example of the method optionally including one or more of the first through fifth examples, correcting the phase-encoded k-space dataset with the phase corrections comprises correcting the phase-encoded k-space dataset with the phase corrections for each view in an echo train. In a seventh example of the method optionally including one or more of the first through sixth examples, correcting the phase-encoded k-space dataset with the phase corrections comprises transforming the phase-encoded k-space dataset into hybrid space in a readout direction and applying the phase corrections to the transformed phase-encoded hybrid dataset.

In another embodiment, a method comprises acquiring a reference dataset without phase encoding, transforming each readout of the reference dataset into hybrid space, calculating phase differences between rows of the transformed reference dataset, calculating a weighted least squares polynomial fitting to the calculated phase differences, acquiring a k-space dataset with phase encoding, applying phase corrections to the k-space dataset according to coefficients of the weighted least squares polynomial fitting, and reconstructing an image from the phase-corrected k-space dataset.

In a first example of the method, the method further comprises transforming each readout of the k-space dataset into the hybrid space, wherein the phase corrections are applied to the k-space dataset in the hybrid space, and transforming the k-space dataset in the hybrid space with the phase corrections back to k-space prior to reconstructing the image. In a second example of the method optionally including the first example, the method further comprises unwrapping the calculated phase differences prior to calculating the weighted least squares polynomial fitting. In a third example of the method optionally including one or more of the first and second examples, the weighted least squares polynomial fitting comprises a constant term, a linear term, a quadratic term, and a cubic term. In a fourth example of the method optionally including one or more of the first through third examples, the method further comprises outputting the image to a display device for display.

In yet another embodiment, a system comprises: a gradient coil unit configured to generate orthogonal gradient fields within an imaging area, the orthogonal gradient fields including a phase-encoding gradient field, a frequency-encoding gradient field, and a slice-selection gradient field; a radio frequency (RF) coil unit configured to transmit an RF pulse to a slice of a subject positioned within the imaging area and receive magnetic resonance (MR) signals therefrom; and a data processing unit communicatively coupled to the gradient coil unit and the RF coil unit, and configured with executable instructions in non-transitory memory that when executed cause the data processing unit to: acquire a reference dataset via the gradient coil unit and the RF coil unit with the phase-encoding gradient field disabled; calculate phase corrections for spatial orders higher than first order from the reference dataset; acquire a k-space dataset via the gradient coil unit and the RF coil unit with the phase-encoding gradient field enabled; correct the k-space dataset with the phase corrections; and reconstruct an image from the corrected k-space dataset.

In a first example of the system, calculating the phase corrections for spatial orders higher than first order from the reference dataset comprises calculating phase differences between neighboring rows of the reference dataset, and calculating a polynomial fit to the calculated phase differences, the polynomial comprising any combination of a constant term, a linear term, a quadratic term, and a cubic term, wherein the phase corrections comprise coefficients of the constant term, the linear term, the quadratic term, and the cubic term, and even higher-order terms, though some terms may be zero depending on the property of the reference data. In a second example of the system optionally including the first example, the data processing unit is further configured with executable instructions in non-transitory memory that when executed cause the data processing unit to transform each readout of the image data into image space, apply the phase corrections to each view, and transform the phase-corrected views back into k-space to generate the corrected k-space dataset. In a third example of the system optionally including one or more of the first and second examples, calculating the phase corrections for spatial orders higher than first order from the reference dataset comprises calculating phase differences between neighboring rows, unwrapping the phase differences, and smoothing the unwrapped phase differences to generate a phase difference vector. In a fourth example of the system optionally including one or more of the first through third examples, correcting the k-space dataset with the phase corrections comprises applying the phase correction vector to each view in the k-space dataset. In a fifth example of the system optionally including one or more of the first through fourth examples, the reference dataset and the k-space dataset are acquired with a zig-zag traversal of k-space, and wherein the phase corrections are applied with alternating signs from view to view of the k-space dataset. In a sixth example of the system optionally including one or more of the first through fifth examples, the system further comprises a display unit communicatively coupled to the data processing unit and comprising a display device, wherein the data processing unit outputs the reconstructed image to the display unit for display on a screen of the display device.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for a magnetic resonance imaging (MRI) system, comprising:
acquiring a non-phase-encoded reference dataset;
transforming the non-phase-encoded reference dataset into a hybrid space;
calculating phase corrections for spatial orders higher than first order from the non-phase-encoded reference dataset in the hybrid space;
acquiring a phase-encoded k-space dataset;
correcting the phase-encoded k-space dataset with the phase corrections; and
reconstructing an image from the corrected phase-encoded k-space dataset.

2. The method of claim 1, wherein calculating the phase corrections for spatial orders higher than first order from the non-phase-encoded reference dataset in the hybrid space comprises calculating phase differences between neighboring rows in the hybrid space, and calculating a polynomial fit to the calculated phase differences, the polynomial comprising at least a cubic term, the phase corrections comprising at least coefficients of the cubic term of each row.

3. The method of claim 2, wherein calculating the polynomial fit to the calculated phase differences comprises calculating a weighted least squares fitting to the calculated phase differences.

4. The method of claim 2, wherein the phase corrections comprise coefficients of the cubic term and at least one of a constant term, a linear term, and a quadratic term of each row.

5. The method of claim 2, wherein correcting the phase-encoded k-space dataset with the phase corrections comprises transforming the phase-encoded k-space dataset into the hybrid space, and applying the phase corrections to corresponding rows in the hybrid space.

6. The method of claim 1, wherein calculating the phase corrections for spatial orders higher than first order from the non-phase-encoded reference dataset further comprises transforming the non-phase-encoded reference dataset into the hybrid space, smoothing the calculated phase differences to generate a phase correction vector, and wherein correcting the phase-encoded k-space dataset with the phase corrections comprises applying the phase correction vector to corresponding rows with an alternating sign from view to view.

7. The method of claim 1, wherein correcting the phase-encoded k-space dataset with the phase corrections comprises correcting the phase-encoded k-space dataset with the phase corrections for each view in an echo train.

8. The method of claim 1, wherein correcting the phase-encoded k-space dataset with the phase corrections comprises transforming the phase-encoded k-space dataset into the hybrid space in a readout direction and applying the phase corrections to the transformed phase-encoded k-space dataset.

9. A method, comprising:
acquiring a reference dataset without phase encoding;
transforming each readout of the reference dataset into a hybrid space;
calculating phase differences between rows of the transformed reference dataset;
calculating a weighted least squares polynomial fitting to the calculated phase differences;
acquiring a k-space dataset with phase encoding;
applying phase corrections to the k-space dataset according to coefficients of the weighted least squares polynomial fitting; and
reconstructing an image from the phase-corrected k-space dataset.

10. The method of claim 9, further comprising transforming each readout of the k-space dataset into the hybrid space, wherein the phase corrections are applied to the k-space dataset in the hybrid space, and transforming the k-space dataset in the hybrid space with the phase corrections back to k-space prior to reconstructing the image.

11. The method of claim 9, further comprising unwrapping the calculated phase differences prior to calculating the weighted least squares polynomial fitting.

12. The method of claim 9, wherein the weighted least squares polynomial fitting comprises a constant term, a linear term, a quadratic term, and a cubic term.

13. The method of claim 9, further comprising outputting the image to a display device for display.

14. A system, comprising:
a gradient coil unit configured to generate orthogonal gradient fields within an imaging area, the orthogonal gradient fields including a phase-encoding gradient field, a frequency-encoding gradient field, and a slice-selection gradient field;
a radio frequency (RF) coil unit configured to transmit an RF pulse to a slice of a subject positioned within the imaging area and receive magnetic resonance (MR) signals therefrom; and
a data processing unit configured to:
acquire a reference dataset via the gradient coil unit and the RF coil unit with the phase-encoding gradient field disabled;
transform the reference dataset into a hybrid space;
calculate phase corrections for spatial orders higher than first order from the reference dataset in the hybrid space;
acquire a k-space dataset via the gradient coil unit and the RF coil unit with the phase-encoding gradient field enabled;
correct the k-space dataset with the phase corrections; and
reconstruct an image from the corrected k-space dataset.

15. The system of claim 14, wherein calculating the phase corrections for spatial orders higher than first order from the reference dataset comprises calculating phase differences between neighboring rows of the reference dataset, and calculating a polynomial fit to the calculated phase differences, the polynomial fit comprising at least a constant term, a linear term, a quadratic term, and a cubic term, and wherein the phase corrections comprise coefficients of the constant term, the linear term, the quadratic term, and the cubic term.

16. The system of claim 14, wherein the data processing unit is further configured with executable instructions in non-transitory memory that, when executed, cause the data processing unit to transform each readout of the k-space dataset into the hybrid space, apply the phase corrections to each view, and transform the phase-corrected views back into k-space to generate the corrected k-space dataset.

17. The system of claim 14, wherein calculating the phase corrections for spatial orders higher than first order from the reference dataset comprises calculating phase differences between neighboring rows, unwrapping the phase differences, and smoothing the unwrapped phase differences to generate a phase difference vector.

18. The system of claim 17, wherein correcting the k-space dataset with the phase corrections comprises applying the phase correction vector to each view in the k-space dataset.

19. The system of claim 14, wherein the reference dataset and the k-space dataset are acquired with a zig-zag traversal of k-space, and wherein the phase corrections are applied with alternating signs from view to view of the k-space dataset.

20. The system of claim 14, further comprising a display unit communicatively coupled to the data processing unit and comprising a display device, wherein the data processing unit outputs the reconstructed image to the display unit for display on a screen of the display device.

\* \* \* \* \*